United States Patent [19]

Milligan

[11] 4,217,822
[45] Aug. 19, 1980

[54] COLOR PRINTING METHOD

[75] Inventor: Donald D. Milligan, Melbourne, Australia

[73] Assignee: Triprint Pty. Ltd., Victoria, Australia

[21] Appl. No.: 931,750

[22] Filed: Aug. 7, 1978

[51] Int. Cl.² .......................... B41C 1/12; B41M 1/14
[52] U.S. Cl. .................................. 101/211; 101/401.1; 430/301
[58] Field of Search .................... 101/211, 401, 401.1, 101/395; 96/30, 35; 358/77, 80

[56] References Cited

U.S. PATENT DOCUMENTS

| | | | |
|---|---|---|---|
| 3,381,612 | 5/1968 | Lecha | 101/211 X |
| 3,926,117 | 12/1975 | Milligan | 101/211 |

OTHER PUBLICATIONS

"Electronic Halftoning for Color Reproduction", IBM Tech Discl. Bulletin, vol. 20, No. 6, Nov. 1977, p. 2423.

*Primary Examiner*—E. H. Eickholt
*Attorney, Agent, or Firm*—Schwartz, Jeffery, Schwaab, Mack, Blumenthal & Koch

[57] ABSTRACT

An improvement in a half-tone primary color printing method where the black color is approximated by balancing the primary color components of the print and where the printing process involves using three primary color printing passes only, includes the steps of:
 (a) preparing separated, differentially angled screen images of the primary color and black components of the print;
 (b) reducing the dot sizes of the screen images corresponding to the respective red, blue and yellow components of the combination plates prior to the combining of each image with its respective black component;
 (c) preparing combination primary color and black half-tone printing plates using the prepared screened primary color images having reduced dot sizes as the primary color component image of each combination plate;
 (d) printing the final color image using said plates and primary color inks; and
 (e) maintaining the density and volume of said inks during said printing process within a range suitable to maintain optimum color density in the final half-tone image despite the reduction of dot sizes of the primary color components of each printing plate. The density of the black component screen image is increased by up to 50% prior to combination with the primary color screen images and thereby enhances the appearance of the half-tone color work and gives the print produced by the method enhanced depth and clarity.

11 Claims, No Drawings

COLOR PRINTING METHOD

This invention relates to an improved method of color printing.

In all commercially used color printing processes involving half-tone work, and those processes involving both line work and half-tone work, such as are used in the printing of labels for canned products, it is necessary to have a separate plate for the line work and half-tone shading which is required to be black in the finished job. When using a single color machine, it is necessary to run a separate pass for the black work. For work involving three or more colors, an additional pass is required on a two color machine. Similarly, a three color press will require an additional pass where four colors are required, and so on.

One method of excluding the black run from a three color half-tone printing process has already been proposed. This method involves the combination of the primary color components of the work with the black shading component of the work, the standard process colors being used with the combined primary color/black printing plates to produce a three color print having simulated black shading areas. The method is described more fully in U.S. Pat. No. 3,381,612 to Lecha.

The above proposed method suffers from several practical problems. Firstly, using the inks described in the specification, the shading and other half-tone work which is required to be black may tend to take on a brownish appearance, thus producing substandard prints. Magenta red does not balance properly with the other inks used, whereas the process yellow is too opaque and suppresses the other colors. Secondly, the process does not provide for the situation where there is both half-tone work and black line work. Using the process as taught by the U.S. Patent would not result in acceptable black line work.

The deficiencies of the Lecha method of printing have been overcome by the method described in our Australian Pat. No. 475,908 (U.S. Pat. No. 3,926,117 Milligan) which is characterized by the use representing the combined blue and black components of the work, the combined red and black components of the work, and the combined yellow and black components of the work, the half-tone work of the red, blue and yellow components having their dot sizes reduced sufficiently before combination with the black component such that the half-tone work is clearly reproduced in the required colors in the print. The method is preferably performed using rubine red, a suitable process blue and a transparent process yellow (or equivalent inks).

Notwithstanding the ability of our improved process to produce better quality color half-tone work than the Lecha method and its ability to produce good quality half-tone/black line work combinations, the half tone work was found to have insufficient depth in certain cases. This is particularly so in background areas as these tended to take on an opaque appearance.

In accordance with the improvement of the present invention, the above problem is at least substantially reduced by increasing the density of each black component image by up to 50% prior to combination with the primary color images.

The objects, features and advantages of the invention will become apparent from the detailed description of the invention which follows.

A preferred form of the invention will now be described in relation to lithographic printing using the three primary colors to produce a four color print. However, it will be appreciated that the invention is equally applicable to other color printing processes, such as Gravure, Letterpress and "Nyloprint" (Registered Trade Mark).

As will be clear from the above description, the method of the invention is based on the use of combination black/primary color plates or the like and the approximation of black line work by suitable balancing the primary color inks. In the preferred form, the inks used are as follows:

(1) Collies New Era Rubine (Pantone) Red 062545
(2) Collies New Era Cyan Concentrated Blue 062170
(3) Collies New Era Extra Transparent Yellow 319511

The preferred method of preparing the black/primary combination plates involves the following steps:

(1) On receipt of the color reflection copy or transparency copy and the line section of the work to be printed, register marks are included on the copy prior to photography.

(2) The usual workshop accepted method of color masking is carried out and a conventional four color set of continuous tone separation negatives are made with a density range of approximately 0.4 to 1.9. The most preferred method is to prepare the negatives from transparency copy, and separation negatives are made in a contact frame with a point source light enabling sharpest screen positives obtainable by one step projection. Final size line negatives are made when there is line work to be combined with screen work.

(3) Screen positives are prepared for the yellow, red, blue and black components by use of a process screen enlarger using grey or magenta contact screens. In accordance with the improvement of the present invention, the black positive has its exposure increased by up to 50% over the exposure of the primary colors to thereby increase the density of the black half-tone dots in the black positive. The increase in density is selected by the etcher depending on the subject matter and color predominance of the half-tone work. For example if black already predominates the half-tone work, the black positive to be combined with the red positive would be decreased in density compared to the other black positives. In this case a density increase of around 20% to 25% should be satisfactory. Similarly if blue or green predominate, the density increase may be of the order of $33\frac{1}{3}\%$ for each black positive. In our experience, most density increases are around $33\frac{1}{3}\% \pm 10\%$. The following screen angles are recommended: yellow 90°, red 45°, blue 105°, and, to avoid screen clash with the larger black dot sizes the black screen angle is changed by about $7\frac{1}{2}\%$ to either side of the usual 75°.

(4) If the screen ruling to be used is 150 lines per inch, the red, blue and black positives are made with this screen and the yellow is made using a 133 screen ruling. Alternatively, using a 133 ruling for red, blue and black, the yellow will then be made on a 120 ruling. This modification of the procedure described in our Australian Pat. No. 475,908 is believed to improve the print quality and substantially reduce the likelihood of screen clash or moire. For some jobs, the screen ruling arrangement described in the above patent may give best results.

(5) In the re-touching department the dot etching will be increased slightly to enable the printer to increase the ink density readings above normal to achieve the best blacks. The increased etching found necessary is approximately: yellow 5%, red 8% to 10% and blue 8% to 10%. This can vary with experience and will depend on some extent on the stock the job will be printed on. Any line work present is not etched and it is necessary to protect the line work from the etching fluid due to the extra exposure given to the black half-tone work.

(6) The black positive is then combined by registering carefully on to the back of the colour positives and contacted to negative. The black positive will be out of contact by the thickness of the film used, normally 0.004 of an inch, but by experience and the use of a point source light, and having made a slightly lower contrast black positive, the gain in contrast can be controlled.

(7) The three color/black set of negatives are used to produce a proof and etching corrections can be made at this stage. A final set of positives will then be contacted from these negatives.

The three combination plates produced as described above are used in the normal manner to print a four color job using the three primary inks defined above. Reference should be had to the specification of our Australian Pat. No. 475,908 for further details relating to the manner in which the basic printing process may be performed.

In use, it is found that the half-tone work produced by the modified method exhibits a superior deeper dimensional effect and the resulting print is brighter and more colorful. Similarly, if black line work is present, this becomes denser due to the greater ink weights required for full print strength with the larger black dots present.

I claim:

1. A half-tone primary color printing method where the black color is approximated by balancing the primary color components of the print and where the printing process involves using three primary color printing passes only, comprising the steps of:
   (a) preparing separated, differentially angled screen images of the primary color and black components of the print;
   (b) reducing the dot sizes of the screen images corresponding to the respective red, blue and yellow components of the combination plates prior to the combining of each image with its respective black component;
   (c) preparing combination primary color and black half-tone printing plates using the prepared screened primary color images having reduced dot sizes as the primary color component image of each combination plate;
   (d) printing the final color image using said plates and primary color inks; and
   (e) maintaining the density and volume of said inks during said printing process within a range suitable to maintain optimum color density in the final half-tone image despite the reduction of dot sizes of the primary color components of each printing plate; characterised by the improvement comprising increasing the density of the black component screen image by up to 50% prior to combination with said primary color screen images whereby the appearance of the half-tone color work is enhanced.

2. The method recited in claim 1, wherein the printing process includes a black line work component, said method resulting in dense black line work in combination with improved half-tone color.

3. The method recited in claim 1, wherein the said dot size reduction of the primary color screened images is carried out with the range of 8% to 10% for the red screened image; 8% to 12% for the blue screened image and 4% to 6% for the yellow screened image.

4. The method recited in claim 1, wherein the printing of said final image is carried out using a color balanced rubine red ink, a color balanced process blue ink and a transparent process yellow ink, in that respective order.

5. The method recited in claim 4, further wherein said balanced process blue ink is a Cyan Concentrated Blue.

6. The method recited in claim 1, wherein said screened images are made using screen angles of 45° for the red component, 105° for the blue component, 90° for the yellow component and approximately 75°±7.5° for the black component.

7. The method recited in claim 6, further including the step of using a screen ruling of 150 lines per inch for producing the primary color screened image components of the half-tone plates, and a screen ruling of 133 lines per inch for producing the black screened image components of said plates, whereby a moire pattern in the shadow areas of the final print due to screen clash is avoided.

8. The method recited in claim 6 using a screen ruling of 133 lines per inch for producing the primary color screened image components of the half-tone plates and a screen ruling of 150 lines per inch for producing the black screened image components of said plates, whereby a moire pattern in the shadow areas of the final print due to screen clash is avoided.

9. The method recited in claim 6, further including the step of using a screen ruling of 150 lines per inch for producing the red, blue and black screened image components of the half-tone plates, and a screen ruling of 133 lines per inch for producing the yellow screened image components of said plates, whereby a moire pattern in the shadow areas of the final print due to screen clash is avoided.

10. The method recited in claim 6 using a screen ruling of 133 lines per inch for producing the red, blue and black screened image components of the half-tone plates and a screen ruling of 120 lines per inch for producing the yellow screened image components of said plates, whereby a moire pattern in the shadow areas of the final print due to screen clash is avoided.

11. The method recited in claim 1 wherein the density of each black component image is increased by 33⅓%±10%.

* * * * *